United States Patent
Kovats et al.

[11] Patent Number: 6,004,833
[45] Date of Patent: Dec. 21, 1999

[54] METHOD FOR CONSTRUCTING A LEADLESS ARRAY PACKAGE

[75] Inventors: Julius A. Kovats, Manitou Springs, Colo.; Paul I. Suciu, Saratoga, Calif.

[73] Assignee: Atmel Corporation, San Jose, Calif.

[21] Appl. No.: 09/216,019

[22] Filed: Dec. 16, 1998

Related U.S. Application Data

[62] Division of application No. 09/063,817, Apr. 21, 1998.

[51] Int. Cl.⁶ ..................................................... H01L 21/40
[52] U.S. Cl. .......................... 438/107; 438/113; 438/460
[58] Field of Search ................................... 438/107, 108, 438/112, 113, 114, 460–465

[56] References Cited

U.S. PATENT DOCUMENTS

| | | |
|---|---|---|
| 4,668,032 | 5/1987 | Bouvier et al. . |
| 5,047,711 | 9/1991 | Smith et al. ............................. 438/462 |
| 5,059,557 | 10/1991 | Cragon et al. ........................... 438/107 |
| 5,126,286 | 6/1992 | Chance .................................... 438/113 |
| 5,239,191 | 8/1993 | Sakumoto et al. ...................... 438/462 |
| 5,241,133 | 8/1993 | Mullen, III et al. . |
| 5,356,838 | 10/1994 | Kim ........................................ 438/465 |
| 5,388,029 | 2/1995 | Moriyama ............................... 257/692 |
| 5,535,101 | 7/1996 | Miles et al. . |
| 5,573,172 | 11/1996 | Gore . |
| 5,731,222 | 3/1998 | Malloy et al. ........................... 438/113 |
| 5,783,464 | 7/1998 | Burns ...................................... 438/112 |
| 5,832,600 | 11/1998 | Hashimoto .............................. 438/107 |
| 5,880,011 | 3/1999 | Zablotny et al. ........................ 438/113 |
| 5,888,884 | 3/1999 | Wosnarowski .......................... 438/462 |
| 5,904,496 | 5/1999 | Richards et al. ........................ 438/462 |

*Primary Examiner*—Kevin M. Picardat
*Attorney, Agent, or Firm*—Thomas Schneck; John P. McGuire, Jr.

[57] ABSTRACT

A method of constructing a leadless array integrated circuit package that mounts directly to a printed circuit board, without pins, but has accessible contacts for testing and inspection. The method includes arranging a series of metal bonding pads on a top side of an insulating substrate and then attaching an array of integrated circuit chips to the metal bonding pads. The integrated circuit chips are encapsulated and then partially separated and electrically isolated prior to testing the chips for any fabrication faults. The chips are then completely separated into individual chip packages. The individual chip packages can then be installed on a printed circuit board. The chip package is heated in a furnace during package fabrication and mounts to the printed circuit board by solder flow contacts on the perimeter of the chip package that melds with solder paste applied to the printed circuit board.

11 Claims, 2 Drawing Sheets

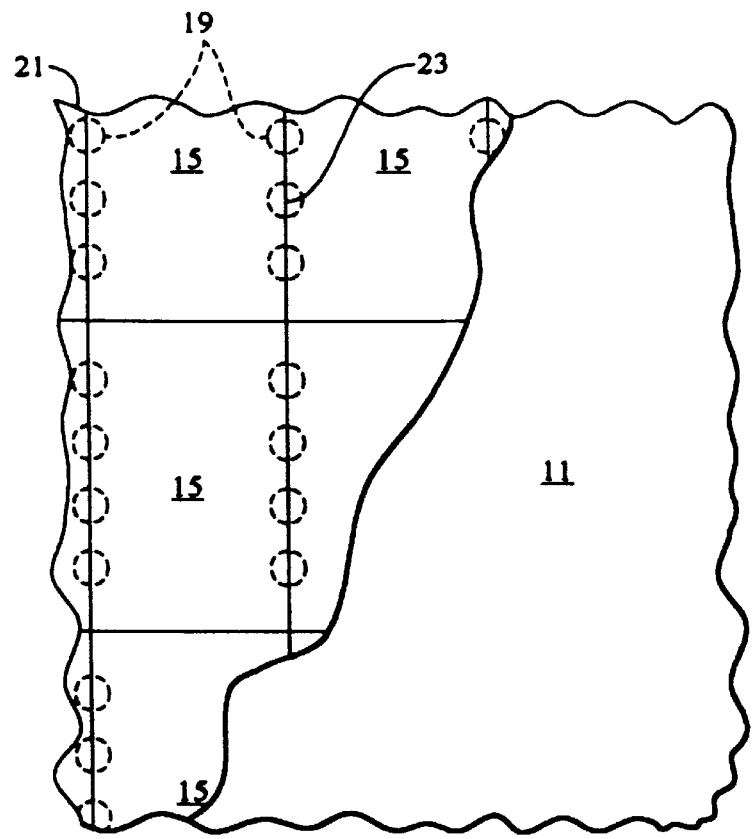
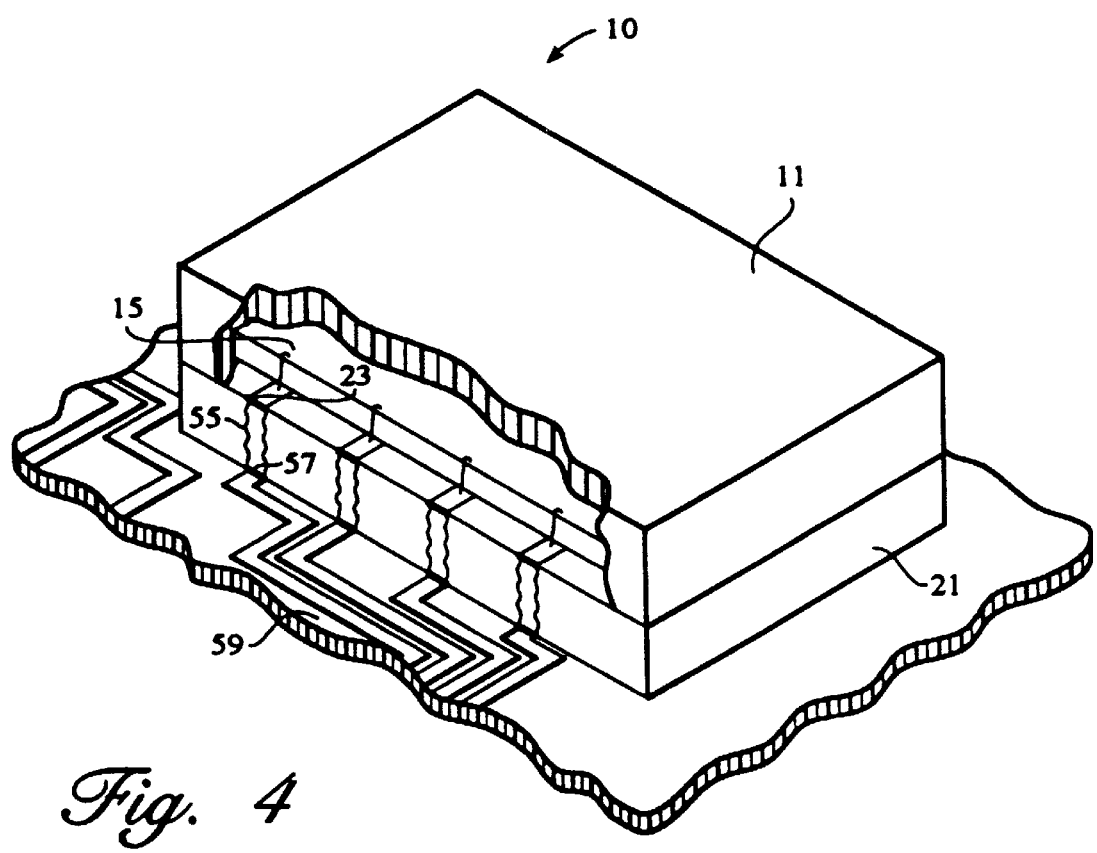

METHOD FOR CONSTRUCTING A LEADLESS ARRAY PACKAGE

CROSS REFERENCE TO RELATED APPLICATION

This is a divisional of patent application Ser. No. 09/063,817; filed Apr. 21, 1998.

FIELD OF THE INVENTION

This invention relates to a method of making integrated circuit packages.

BACKGROUND ART

In integrated circuit fabrication, a continuing challenge is to manufacture electrical assemblies with greater densities and smaller package size. It is extremely important to utilize available space on a printed circuit board in the most efficient manner possible. The trend in integrated circuit packaging is away from traditional dual-in-line and through-hole packaging and towards surface-mount packages, such as small outline packages, ball grid arrays and chip carrier packages. Surface mounting is a process in which a packaged IC is physically mounted onto the surface of a printed circuit board (PCB), rather than inserting leads into plated holes through the PCB. Package specifications, such as outlines, pin configuration, and dimensions are often defined by industry associations, such as JEDEC.

Most surface-mount devices use leads to mount the chip packages onto the surface of a PCB. Small outline IC packages (SOICs) and quad flat packs (QFPs) frequently use "gull wing" leads, which spread away from the device. The main advantage of the gull wing is that the solder joint can be easily inspected. The disadvantage is that the exposed leads tend to bend and break in handling prior to reflow on the system board. Another disadvantage is that the leads take additional space on the PCB since the leads are spread out.

Another type of leads used are "J leads", in which the leads are tucked under the device and shaped like the letter "J". "J-leads" are commonly used on plastic-leaded chip carriers (PLCCs). The advantages of the "J-leads" are that they occupy less board space and that the leads are protected underneath the device. However, this makes it more difficult to test, inspect or repair the device and does not allow for low profile mounting.

Leadless integrated circuit packaging is known in the prior art. U.S. Pat. No. 5,535,101 to Miles et al. discloses a leadless integrated circuit package that uses a ball grid array for mounting to the printed circuit board. A ball grid array mounts to the printed circuit board using solder balls located on the underside of the package. There are some advantages to this arrangement such as the package being smaller in size due to the lack of leads jutting out from the edge of the package. However, there are some disadvantages to the ball grid array (BGA) system. Firstly, the solder joints are hidden beneath the package, making visual inspection and in-situ probe testing virtually impossible. Also, the cost of a BGA system is higher because BGAs have a circuit board that holds the chip and fans out the leads. Although BGAs take less space from an area standpoint, routing traces to them use more PCB layers. This can serve to increase the cost of the overall system.

SUMMARY OF THE INVENTION

The present invention is a method of constructing an integrated circuit package that mounts directly to a printed circuit board, without pins, but has accessible contacts for testing and inspection. The method includes arranging a series of metal bonding pads on a top side of a base layer made of an insulating substrate, and then attaching an array of integrated circuit chips to the metal bonding pads. The integrated circuit chips are covered with an encapsulant material and then the base layer is partially separated and electrically isolated into individual chip packages. The individual chip packages are then tested on the base layer to determine whether there are any fabrication faults, and the base layer is then separated completely so that the chip packages are singulated into individual chip packages.

The individual chip packages can then be installed on a printed circuit board. The installation includes placing one of the individual chip packages on top of solder pads on a user's printed circuit board and applying solder paste to the solder pads. Then, the printed circuit board and the leadless array package are heated to obtain a solder flow between the solder pads of the printed circuit board and the metal bonding pads on the top side of the base layer of the chip package. The printed circuit board and the chip package are then cooled to obtain a connection between the printed circuit board and the chip package.

BRIEF DESCRIPTION OF THE DRAWINGS

FIG. 3 is another top view of an arrangement of leadless array packages during a manufacturing stage illustrating a second embodiment of the invention.

FIG. 4 is a perspective view of a leadless array package illustrating the method of mounting the package on the end user's printed circuit board.

BEST MODE FOR CARRYING OUT THE INVENTION

Figure 1:
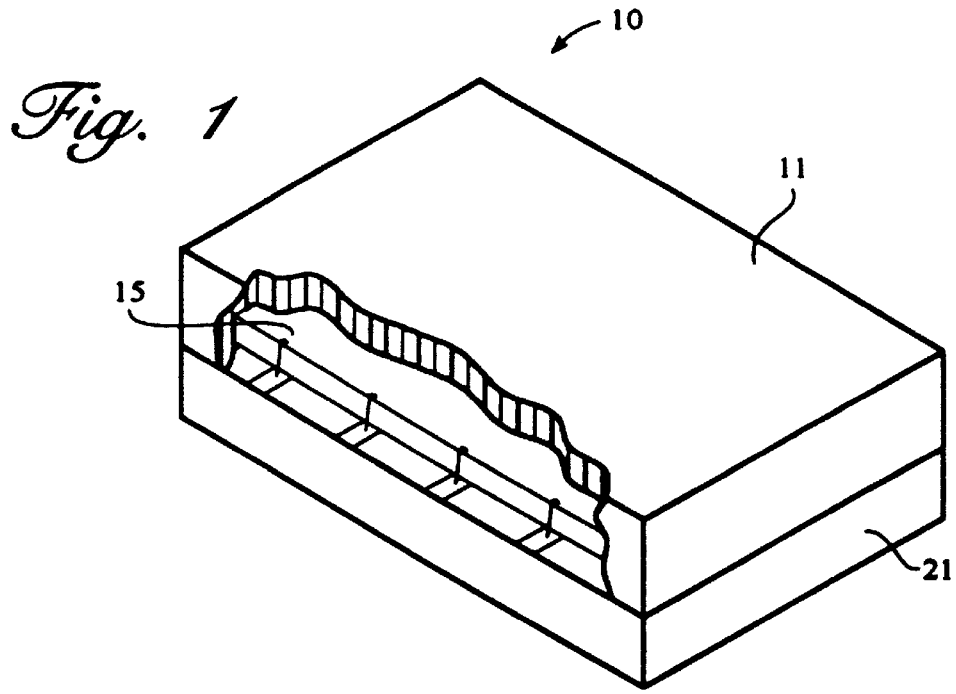
FIG. 1 is a perspective view of a leadless array package constructed using the method of the present invention.

With reference to FIG. 1, the leadless array package 10 is assembled in a sort of "sandwich" arrangement. A base layer 21, made of a substrate material, comprises the bottom of the leadless array package. An integrated circuit chip 15 is bonded on top of the base layer 21, and an encapsulant material 11 covers the top of the integrated circuit chip 15 and the base layer 21. The complete leadless array package 10 is then ready to be mounted on the end user's printed circuit board.

Figure 2:
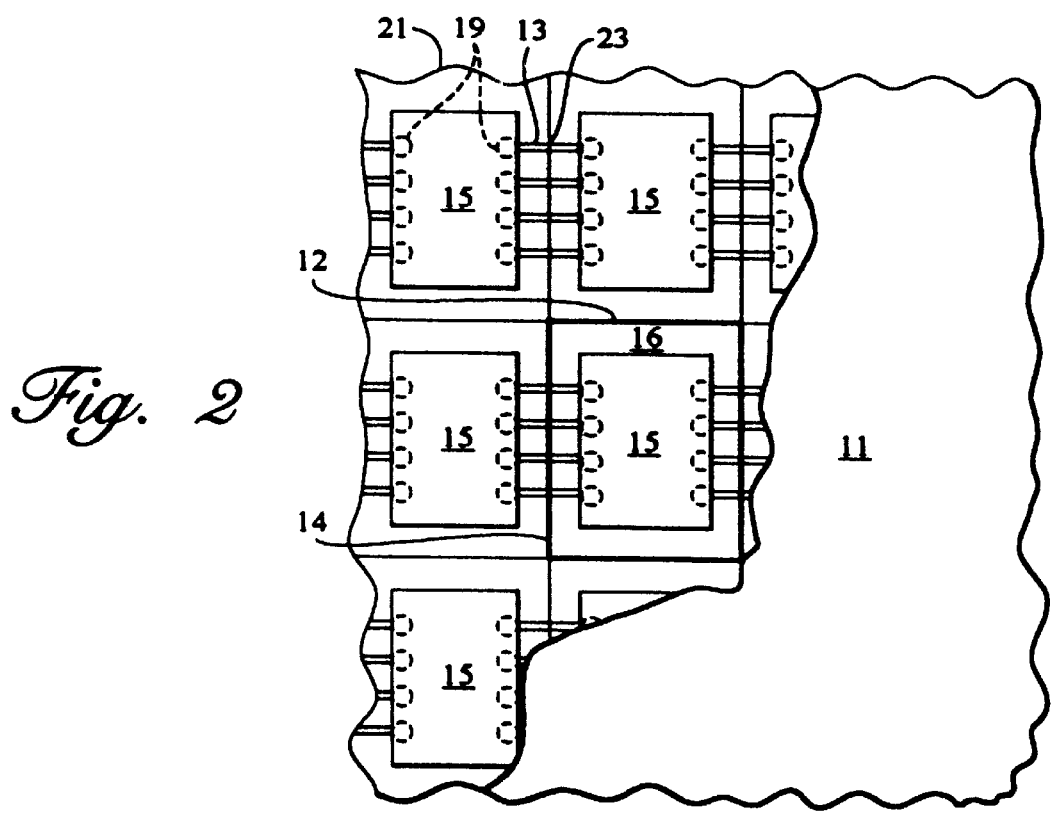
FIG. 2 is a top view of an arrangement of leadless array packages during a manufacturing stage illustrating a first embodiment of the invention.

With reference to FIG. 2, the base layer 21 is made of a substrate material such as epoxy-glass or another suitable material that is commonly used for manufacturing printed circuit boards. The reason for using this type of substrate material for the base layer 21 is that by using the same or similar material for the substrate as that material of which the end user's printed circuit board is made, the possibility of thermal mismatch is significantly reduced. By reducing the possibility of thermal mismatch, mechanical stresses due to differing thermal expansion coefficients are reduced, which consequently reduces the possibility of solder and wire bond failures in the chip package. The base layer 21 will eventually be singulated, at the end of the manufacturing process, into individual separate base layer areas 16, one base layer area for each chip. The length 14 and width 12 of each individual base layer area 16 is equivalent to the standard dimensions of a small outline integrated circuit (SOIC) chip package footprint. The substrate material for the base layer 21 is generally thin, having a nominal thickness of approximately 0.38–0.64 millimeters. In one embodiment of this invention, the base layer is made of an 35 mm epoxy-glass tape that is packaged on a roll, similar to 35 mm movie film. The use of the epoxy-glass tape in this form makes the manufacturing process compatible with many automated handling, testing and placement systems and is also convenient for parallel testing.

The method of the present invention may also be able to be used with other types of IC footprints, such as TSOP, but it must be used with an integrated circuit chip having a small lead count (32 pins or smaller). This is because the leads of the IC chip must be on the perimeter of the IC chip in order to be accessible after mounting. The number of leads are limited by the size of the perimeter of the IC chip. Even at minimum width, spacing must exist between leads to prevent shorting. To gain additional space, all four sides of the chip may be used for leads, provided that the user can provide PCB routing for the leads. If the IC chip is too large, thermal mismatches between the silicon die of the chip and the base layer substrate are too great and the chip package would be very likely to crack. The proper size chip must be determined for each base layer area.

Continuing with reference to FIG. 2, on top of the base layer 21 are arranged a series of metal bonding pads 19 on which the integrated circuit chips 15 can be mounted. The metal bonding pads 19 are arranged to correspond to the size of the integrated circuit chip 15. The metal pads 19 can be arranged to accommodate IC chips having contacts on two sides or four sides. In FIG. 2, the contacts are shown to be on two sides of the IC chip. The integrated circuit chip 15 is generally smaller than the individual base layer area 16, but it can be the same size as the base layer area 16 (and hence, the same size as a standard SOIC package). In FIG. 2, the integrated circuit chip 15 is smaller than the base layer area 16. One integrated circuit chip 15 is to be mounted in each base layer area 16. Over the entire base layer 21, a large array of integrated circuit chips (such as 100×150 chips) can be laid out. It is advantageous to manufacture a large number of chip packages at one time, as it saves time and cost to be able to manufacture and test a large number of chip packages at once. When the IC chips 15 are laid out on the base layer 21, die are attached to the top side of the board and are wire bonded 13 between the metal chip pads 19 and the board contacts 23, which are on the edge of each individual base layer area 16. When the industry standard size chip is used, as in FIG. 2, generally there is about 1.4 mm of space between the edge of the chip 15 and the edge of the base layer 21 to allow for standard wire bond and die attachment.

FIG. 3 serves to illustrate the case when the size of the IC chip 15 is the same as the size of the base layer area (defined in FIG. 2 as the area having the length 14 and width 12 of the standard SOIC package). In this case, the distance between the metal chip pads 19 and the board contacts 23 is minimal and, instead of wire bonding, flip chip/bump technology is used to attach the IC chip 15 to the base layer area 16.

Referring back again to FIG. 2, after wire bonding and die attachment, an encapsulant material 11, preferably an epoxy overcoat or plastic molding, is applied over the entire array of integrated circuit chips 15 and the base layer 21. Generally, this encapsulant material should be no more than 2 mm in thickness. Then, the entire base layer 21, having IC chips attached and covered by the encapsulant material 11, is partially divided into individual array packages. The partial singulation electrically isolates each individual chip package from the other chip packages so that they may be individually tested. As discussed above, the size of the individual chip array package is the same as that of the standard dimensions of a SOIC chip package. In this way, the array package will fit in the standard size SOIC footprint.

After the partial division into individual chip packages described above, the chip packages are tested. Typically, these tests will consist of the standard industry production tests that are intended to determine whether there are any localized fabrication faults that will cause failure of the integrated circuit. These tests can be carried out by conventional testing equipment, such as probe cards or wafer probers and the like. Most conventional testing devices have probes that are small enough to contact the board contacts 23 (that are connected to the bonding pads). The potential also exists for testing several of the chip packages in parallel. After the chips are tested and are found to have been in compliance with the test requirements, the base layer is completely divided into individual chip packages. This final singulation after testing is generally just a laser cut to completely separate the chip packages (all of the electrical connections between the chip packages having already been separated before testing).

With reference to FIG. 4, the completed IC array package 10, can be installed on the end-user's printed circuit board 59. The IC array package 10 is placed on top of solder pads 57 on the printed circuit board 59. The solder pads 57 correspond to the board contacts 23 which are exposed on the edge of the IC array package 10. Solder paste is applied to the solder pads 57 and then the printed circuit board 59 and IC array package are heated in a convection furnace. The solder paste wicks up and there is solder flow 55 between the solder pads 57 and the board contacts 23. When the solder flow cools, after removal from the furnace, an electrical and mechanical connection exists between the leadless array package 10 and the printed circuit board 59 of the end user.

What is claimed is:

1. A method for constructing a leadless integrated circuit package, the method comprising the steps of:

providing a roll of tape of a substrate material, the tape being a base layer;

arranging a series of metal bonding pads on a top side of the base layer;

placing an array of integrated circuit chips on the tape and attaching the integrated circuit chins to the metal bonding pads;

covering the integrated circuit chips and the base layer with an encapsulant material;

separating partially and electrically isolating the base layer into individual chip packages;

testing the individual chip packages on the base layer to determine whether there are any fabrication faults; and separating the base layer completely so that the chip packages are singulated into individual chip packages.

2. A method for constructing a leadless integrated circuit package, as in claim 1, wherein the integrated circuit chips and the base layer each have a length and a width, the length and the width of the integrated circuit chips being smaller than the length and the width of the base layer.

3. A method for constructing a leadless integrated circuit package, as in claim 1, wherein the integrated circuit chips and the base layer each have a length and a width, the length and the width of the integrated circuit chip being equal to the length and the width of the base layer.

4. A method for constructing a leadless array circuit package, as in claim 1, further comprising the step of installing one of the individual chip packages on a printed wiring board.

5. A method for constructing a leadless array circuit package, as in claim 4, wherein the step of installing one of the individual chip packages on a printed wiring board comprises:

placing one of the individual chip packages on top of solder pads on the printed circuit board;

applying solder paste to the solder pads;

heating the printed circuit board and the chip package to cause the solder paste to wick up, thereby obtaining a solder flow between the solder pads and the metal bonding pads on the top side of the base layer of the chip package; and cooling the printed circuit board and the chip package to obtain a connection between the printed circuit board and the chip package.

6. A method for constructing a leadless integrated circuit package as in claim 1, wherein the tape is made of epoxy-glass.

7. A method for constructing a leadless integrated circuit package, the method comprising the steps of:

providing a roll of tape of a substrate material, the tape being a base layer;

arranging a series of metal bonding pads on a top side of the base layer;

placing an array of integrated circuit chips on the tape and attaching the integrated circuit chips to the metal bonding pads;

covering the integrated circuit chips and the base layer with an encapsulant material;

separating partially and electrically isolating the base layer into individual chip packages;

testing the individual chip packages on the base layer to determine whether there are any fabrication faults;

separating the base layer completely so that the chip packages are singulated into individual chip packages; and installing one of the individual chip packages on a printed wiring board.

8. A method for constructing a leadless integrated circuit package, as in claim 7, wherein the integrated circuit chips and the base layer each have a length and a width, the length and the width of the integrated circuit chips being smaller than the length and the width of the base layer.

9. A method for constructing a leadless integrated circuit package, as in claim 7, wherein the integrated circuit chips and the base layer each have a length and a width, the length and the width of the integrated circuit chip being equal to the length and the width of the base layer.

10. A method for constructing a leadless array circuit package, as in claim 7, wherein the step of installing one of the individual chip packages on a printed wiring board comprises:

placing one of the individual chip packages on top of solder pads on the printed circuit board;

applying solder paste to the solder pads;

heating the printed circuit board and the chip package to cause the solder paste to wick up, thereby obtaining a solder flow between the solder pads and the metal bonding pads on the top side of the base layer of the chip package; and cooling the printed circuit board and the chip package to obtain a connection between the chip package and the printed circuit board.

11. A method for constructing a leadless integrated circuit package, as in claim 7, wherein the tape is made of epoxy-glass.

* * * * *